(12) United States Patent
Kiesel et al.

(10) Patent No.: US 7,314,801 B2
(45) Date of Patent: Jan. 1, 2008

(54) SEMICONDUCTOR DEVICE HAVING A SURFACE CONDUCTING CHANNEL AND METHOD OF FORMING

(75) Inventors: Peter Kiesel, Palo Alto, CA (US); Oliver Schmidt, Palo Alto, CA (US); Arnd Willy Walter Geis, Menlo Park, CA (US); Noble Marshall Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 146 days.

(21) Appl. No.: 11/313,341

(22) Filed: Dec. 20, 2005

(65) Prior Publication Data

US 2007/0141789 A1    Jun. 21, 2007

(51) Int. Cl.
   *H01L 21/336* (2006.01)
(52) U.S. Cl. .......................... 438/282; 438/22; 438/49; 438/136; 438/137; 438/138; 438/146; 438/290; 257/134; 257/646; 257/E21.411
(58) Field of Classification Search ............... 438/136, 438/137, 138, 146, 22, 49, 282, 290; 257/134, 257/646, E21.411
   See application file for complete search history.

(56) References Cited

U.S. PATENT DOCUMENTS 6,617,183 B2 *   9/2003   Kadota et al. ................. 438/22
2003/0218222 A1 * 11/2003   Wager et al. ................ 257/410
2006/0244107 A1 * 11/2006   Sugihara et al. ............ 257/646

FOREIGN PATENT DOCUMENTS

| EP | 1544907 | 6/2005 |
|---|---|---|
| WO | WO2004114391 | 12/2004 |
| WO | WO2005074038 | 8/2005 |

OTHER PUBLICATIONS

Oliver Schmidt, Peter Kiesel, Chris G. Van de Walle, Noble M. Johnson, Jeff Nause and Gottfried H. Döhler, "Evidence for an electrically conducting layer at the native zinc oxide surface," *Jpn. J. Appl. Phys.* Part 1, vol. 44, 7271-7274 (2005) (published Oct. 11, 2005).

Oliver Schmidt, Arnd Geis, Peter Kiesel, Chris G. Van de Walle, Noble M. Johnson, Andrey Bakin, Andreas Waag and Gottfried H. Döhler, "Analysis of a Conducting Channel at the Native Zinc Oxide Surface," *Superlattices and Microstructures*, 39 (2006) 8-16.

(Continued)

*Primary Examiner*—Michael Lebentritt
*Assistant Examiner*—Kyoung Lee
(74) *Attorney, Agent, or Firm*—Marger Johnson & McCollom, P.C.

(57) ABSTRACT

A semiconductor device including a metal oxide layer, a channel area of the metal oxide layer, a preservation layer formed on the channel area of the metal oxide layer, and at least two channel contacts coupled to the channel area of the metal oxide layer, and a method of forming the same.

8 Claims, 4 Drawing Sheets

OTHER PUBLICATIONS

O. Schmidt, P. Kiesel, C.G. Van De Walle, N.M. Johnson, J. Nause, G.H. Doehler; "Effects of an Electrically Conducting Layer at the Zinc Oxide Surface," Japanese Journal of Applied Physics, vol. 44, No. 10, Oct. 11, 2005 pp. 7271-7274.

Hong David et al., "Passivation of zinc-tin-oxide tin-film transistors," Journal of Vacuum Science and Technology. B23(6), Microelectronics and nanometer Structures Processing, Measurement and Phenomena, American Institute of Physics, New York, NY, US, Nov./Dec. 2005, pp. 25-27.

Look, D.C., et al., "Effects of surface conduction on Hall-effect measurements in ZnO," Superlattices and Microstructures, Academic Press, London, GB, vol. 38, No. 4-6, Oct. 2005, pp. 406-412.

Kwon, Y., et al., "Enhancement-mode thin-film field-effect transistor using phosphorus-doped (Zn,Mg) O channel," Applied Physics Letters, AIP, American Institute of Physics, Melville, NY, US, vol. 84, No. 14, Apr. 5, 2004 pp. 2685-2687.

* cited by examiner

SEMICONDUCTOR DEVICE HAVING A SURFACE CONDUCTING CHANNEL AND METHOD OF FORMING

GOVERNMENT FUNDING

This invention was made with Government support under Contract No. F49620-02-01-0343, issued by the Air Force Office of Scientific Research. The Government has certain rights in this invention.

BACKGROUND

Semiconductor devices include transistors. A transistor may modulate a current flowing through it in response to an input signal. One example of a type of a transistor is a field effect transistor (FET). An FET may change the characteristics of a channel in response to the input signal. The input signal affects the characteristics of the channel such as the carrier concentration and the carrier type. By affecting the characteristics of the channel, the input signal may modulate current flowing through the channel, and hence, flowing through the transistor. Typically, such a transistor may include a source and a drain coupled to the channel. A gate receives the input signal to modulate the channel.

An FET may also be characterized as an enhancement mode or a depletion mode FET. Enhancement or depletion mode describes the carrier concentrations with no input signal applied. An enhancement mode or a depletion mode FET may also be referred to as a normally off or normally on FET. In a normally on FET, without any input signal applied, the transistor will conduct. Conversely, with a normally off FET, the transistor may not conduct until an input signal is applied.

Typically, the manufacture of transistors involves several processes. Such processes may include forming a heterostructure using two different semiconductor types, doping a semiconductor to create n and p type regions, and using ion implantation to form the channel of the transistor. These processes add complexity in the manufacturing of a transistor. Furthermore, for some semiconductor types, the creation of a p or n type region may be impracticable.

SUMMARY

An embodiment includes a semiconductor device including a metal oxide layer, a channel area of the metal oxide layer, a preservation layer formed on the channel area of the metal oxide layer, and at least two channel contacts coupled to the channel area of the metal oxide layer.

A further embodiment includes a method of making a semiconductor device including providing a metal oxide layer having a surface, defining a channel area by forming a preservation layer on the surface, and forming at least two channel contacts coupled to the channel area.

DETAILED DESCRIPTION

The electrical properties of metal oxides, such as a high-resistivity zinc oxide (ZnO) may be influenced by environmental conditions. The atmosphere within which is contained a sample of a metal oxide may affect the conductivity of the sample. For example, a sample of ZnO in an ambient atmosphere may exhibit a high resistivity. However, if the atmosphere is a vacuum, the resistivity of the surface of the sample is lower than the resistivity of both the surface and the bulk of the sample in the ambient atmosphere. The lower resistivity of the surface of the sample may be preserved by applying a preservation layer to the surface of the sample. When the sample, having a preservation layer applied to the surface, is removed from the vacuum, the lower resistivity of the surface as it was in the vacuum is preserved.

Figure 1:
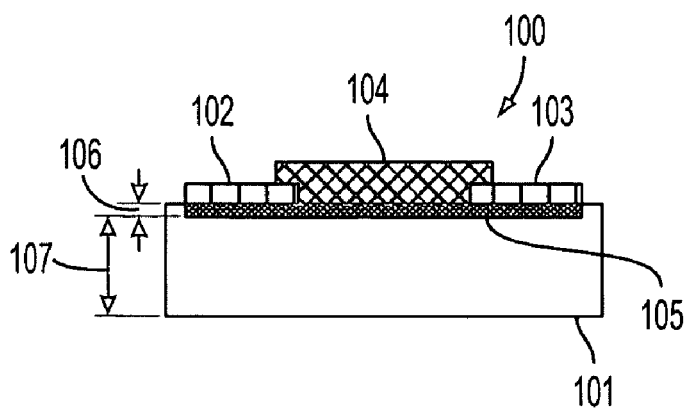
FIG. 1 shows a cross sectional view of an example of a semiconductor device having a surface conducting channel.

FIG. 1 is a cross-sectional view of an example of a semiconductor device having a surface conducting channel. The semiconductor device 100 includes a metal oxide layer 101, a first and a second channel contact 102 and 103, and a preservation layer 104. The metal oxide layer 101 may be a layer of ZnO or MgZnO, for example. In addition, the metal oxide layer may be a material with a high piezoelectric constant.

The metal oxide layer 101 includes a surface region 106 and a bulk region 107. The surface region 106 includes both the surface of the metal oxide layer 101 and a portion of the bulk of the metal oxide layer directly beneath the surface. The surface region 106 may have a lower resistivity due to special treatments and materials properties as discussed below with reference to FIG. 11.

The preservation layer 104 is formed on a channel area 105. Before forming the preservation layer 104, the channel area 105 may have the characteristics of the rest of the metal oxide layer 101 resulting from the atmosphere the metal oxide layer 101 is in. The preservation layer 104 is formed to preserve the lower resistivity state of the surface of the metal oxide layer 101. The area where the lower resistivity state of the surface is preserved is referred to as the channel area 105. The channel area 105 is part of the surface region 105. Thus, the channel area 105 includes not only the surface of the metal oxide layer 101 under the preservation layer 104, but also includes a portion of the metal oxide layer 101 directly beneath that surface. Although the channel area 105 has been labeled an "area", the channel area 105 describes a three dimensional volume beneath the preservation layer 104. The channel contacts 102 and 103 are coupled to the channel area 105 of the metal oxide layer 101. Depending on the material of the channel contacts 102 and 103, the channel area 105 may extend beneath the channel contacts 102 and 103. In addition, since the more conductive channel area 105 is close to the surface of the metal oxide layer 101, the conductivity between the two channel contacts is dominated by the channel area 105. Therefore it can be easily modulated by an exterior electric field.

The preservation layer 104 may overlap the channel contacts 102 and 103. As a result, the channel area 105 may extend from the first channel contact 102 to the second channel contact 103. Then, connections may be made to the semiconductor device 100 at the channel contacts 102 and 103 to use the channel area 105 under the preservation layer 104.

The preservation layer 104 is preferably an insulating material. For example, the preservation layer 104 may be a dielectric layer formed of $SiO_x$, $Ga_2O_3$, or $Si_3N_4$. (X of $SiO_x$ may be real number greater than or equal to one.) Furthermore, the preservation layer 104 may also be a variety of oxides, including, for example, $GaO_3$, $ZnN_3$, TaC, AlN, and BN. In addition, the preservation layer 104 may be substantially impermeable to gas. As described above, the conductivity of a surface of a metal oxide may change due to the environmental conditions, particularly the atmosphere. By using the preservation layer 104, a state of the conductivity of the surface may be preserved. To achieve this, the preservation layer 104 may prevent molecules from the environment from affecting the channel area 105. Particular examples of molecules that the preservation layer 104 may be impermeable to include oxygen, nitrogen, and molecules including a hydroxyl group. The preservation layer 104 may be impermeable to some or all of the listed molecules, in addition to other unlisted molecules.

Figure 2:
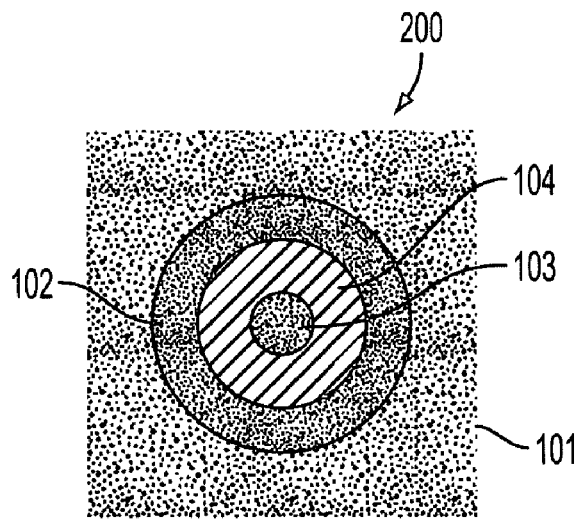
FIG. 2 shows a plan view of another example of a semiconductor device having a surface conducting channel.

FIG. 2 shows a plan view of another example of a semiconductor device 200 having a surface conducting channel. The first channel contact 102 bounds an area of the surface of the metal oxide layer 101. The second channel contact 103 is formed within the area bounded by the first channel contact 102. The area between the first and second channel contacts 102 and 103 is covered by the preservation layer 104. In this example, all of the surface between any part of the channel contacts 102 and 103 is covered by the preservation layer 104.

Although first channel contact 102 has been shown as a circular shape in FIG. 2, the first channel contact 102 may be formed in any pattern. For example, the first channel contact 102 may be a square, a pentagon, a polygon, or any other continuous path bounding an area of the surface of the metal oxide layer 101.

Figure 3:
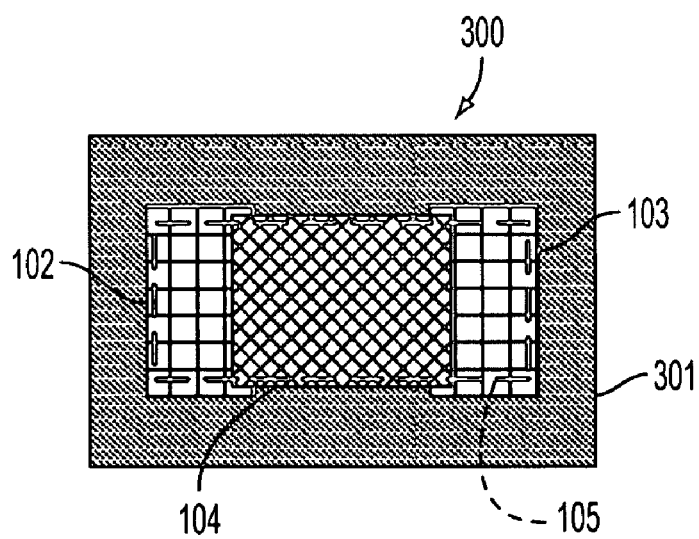
FIG. 3 shows a plan view of another example of a semiconductor device having a surface conducting channel.

FIG. 3 shows a plan view of another example of a semiconductor device 300 having a surface conducting channel. An insulating preservation layer 301 may be formed on the surface of the metal oxide layer 101 around the semiconductor device 300. The insulating preservation layer 301 preserves the high resistivity state of the metal oxide layer 101, just as the preservation layer 104 preserves the lower resistivity state. Thus, the channel area 105 is formed under the preservation layer 104 and not the insulating preservation layer 301.

Figure 4:
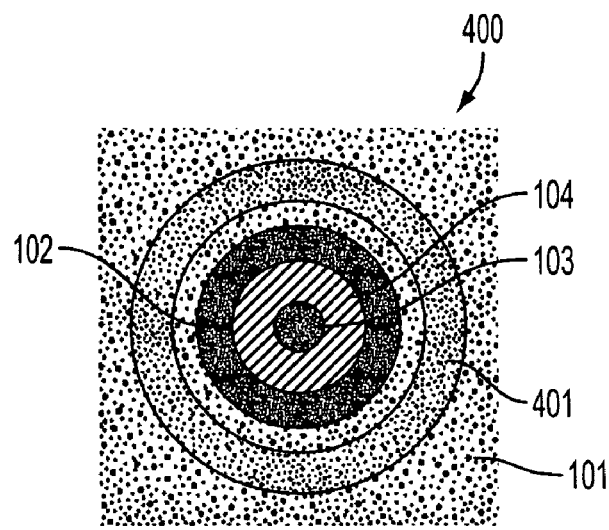
FIG. 4 shows a plan view including an isolation region of another example of a semiconductor device having a surface conducting channel.

FIG. 4 shows a plan view of an example of a semiconductor device having a surface conducting channel. The semiconductor device 400 may have a region 401. The region 401 may be an isolation region. The isolation region prevents interaction between the semiconductor device 400 and any adjacent semiconductor devices on the metal oxide layer 101. If the surface of the metal oxide layer 101 between the first channel contact 102 of the semiconductor device 400 and another semiconductor device 400 is not covered by some layer or interrupted by some structure, the resistivity of the surface may change as the environment changes. Thus, adjacent semiconductor devices 400 may be coupled as a result of an environmental change. The isolation region prevents this coupling.

Alternatively, the region 401 may be an insulating preservation layer. As described above, forming an insulating preservation layer in region 401 may preserve the high resistivity of the surface from changing due to the environmental conditions. This insulating preservation layer isolates adjacent semiconductor devices 400 from each other.

Although the region 401 which may be the isolation region or the insulating preservation layer have been show not overlapping the first channel contact 102, the isolation region and the insulating preservation layer may overlap the first channel contact 102.

Figure 5:
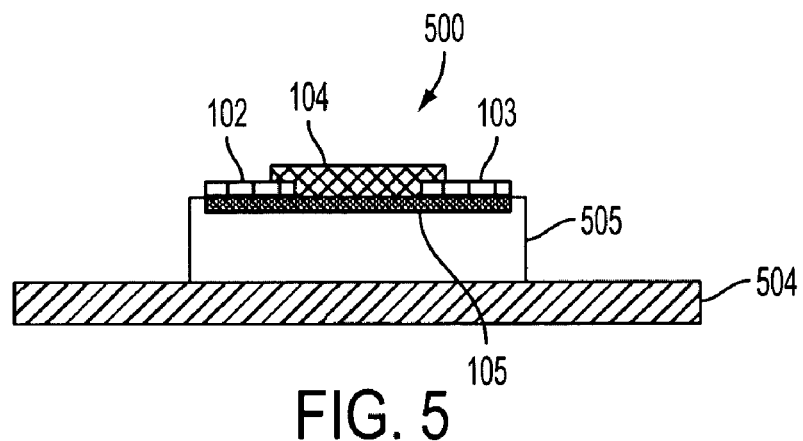
FIG. 5 shows a cross sectional view of another example of a semiconductor device having a surface conducting channel formed on a mesa.

FIG. 5 shows a cross sectional view of another example of a semiconductor device 500 having a surface conducting channel formed on a mesa 505. Instead of forming the semiconductor device 500 on a plane of a metal oxide layer 101, the semiconductor device 500 may be formed on a mesa 505 of the metal oxide layer 101. The mesa 505 is the metal oxide layer 101. Thus, if adjacent semiconductor devices are formed on individual mesas 505, the semiconductor devices 500 are isolated from each other. The mesa 505 may be formed on a substrate 504. The substrate 504 may be any non-conductive or semiconductive substrate. Such substrates may include, for example, glass sapphire, or other insulating materials, and layers of such insulating materials formed on other substrates.

Although several structures isolating semiconductor devices from each other have been described, such isolations regions and techniques are not required. A connection between a number of semiconductor devices may be desired and the isolation region may not be used between the semiconductor devices. Furthermore, any such isolation region or technique may be used to isolate a set of semiconductor devices from one or more other semiconductor devices.

Figure 6:
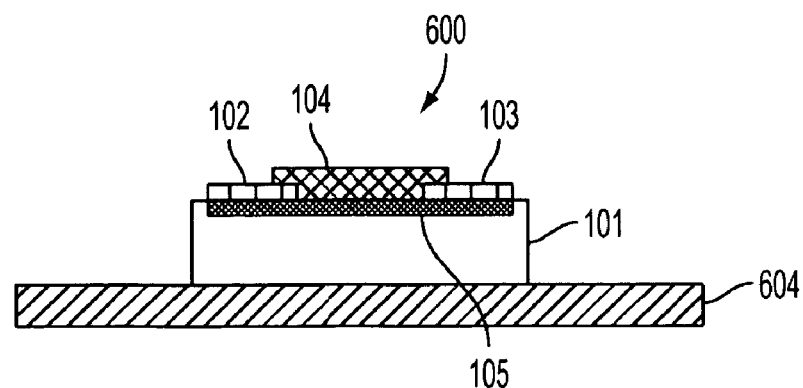
FIG. 6 shows a cross sectional view of another example of a semiconductor device having a surface conducting channel formed on a substrate.

FIG. 6 shows a cross sectional view of another example of a semiconductor device 600 having a surface conducting channel formed on a substrate 504. Referring to FIG. 6, just as the mesa 505 may be formed on a substrate 504, the metal oxide layer 101 may be formed on a substrate 504. The metal oxide layer 101 may substantially cover a surface of the substrate 504.

Figure 7:
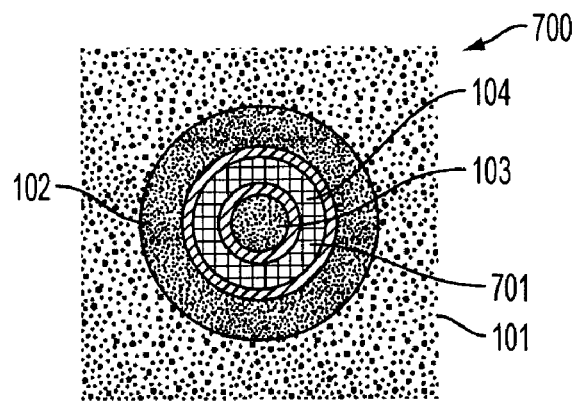
FIG. 7 shows a plan view of another example of a semiconductor device having a surface conducting channel formed with a gate.

FIG. 7 shows another example of a semiconductor device 700 having a surface conducting channel formed with a gate. Preferably, a gate 701 formed on the preservation layer is formed such that every path from the first channel contact 102 to the second channel contact 103 through the channel area 105 passes under the gate 701. In the example illustrated in FIG. 7, the gate 701 may be a circle, smaller in diameter than the first channel contact 102 and larger in diameter than the second channel contact 103. As a result, every path through the channel area 105 passes under the gate 701.

Figure 8:
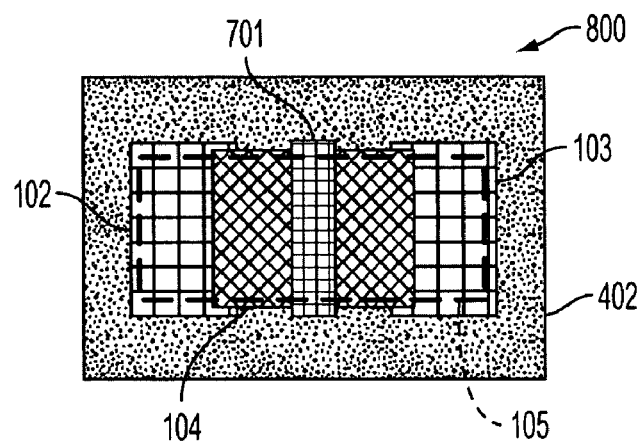
FIG. 8 shows a plan view of another example of a semiconductor device having a surface conducting channel formed with an insulating preservation layer.

Alternatively, as shown in FIG. 8, illustrating a plan view of another example of a semiconductor device 800 using an insulating preservation layer 402, the gate 701 is formed across the channel area 105. Although the channel area 105 has been illustrated slightly within the preservation layer 104 and the channel contacts 102 and 103, the boundary of the channel area 105 is for illustration only. Such a channel area 105 may extend to the edges of the preservation layer 104, extend to the edges of the channel contacts 102 and 103, or any combination or sub part of such layers. Since the gate 701 crosses the preservation layer 104, there is no path through the channel area 105 that does not pass under the gate 701.

Figure 9:
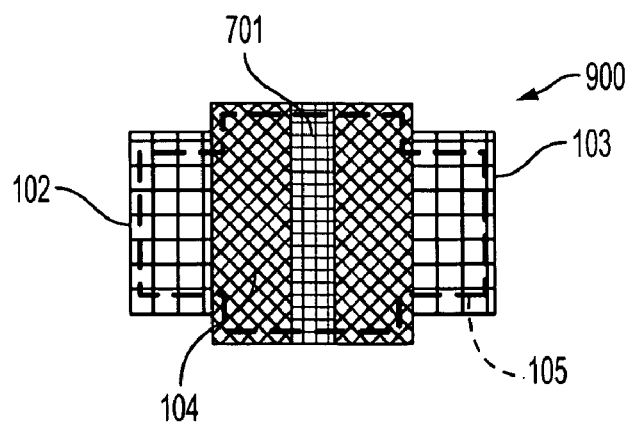
FIG. 9 shows a plan view of another example of a semiconductor device having a surface conducting channel formed on a mesa.

In addition, as shown in FIG. 9, illustrating a semiconductor device using a mesa as an isolating technique, the gate 701 overlaps any path through the channel area 105.

The gate 701 may be formed of a metal or other conductive layer. Thus, a signal may be applied to the gate to modulate the resistivity of the channel area 105 between the channel contacts 102 and 103.

Alternatively, the gate 701 may be a transparent conductive oxide layer. As a result, depending on the transparency of the other portions of the semiconductor device 900, all or portions of the semiconductor device 900 may be transparent.

In addition, the gate 701 may be a biological or chemical gate. Biological and chemical sensors used as the gate 701 may allow the semiconductor device to be used, for instance, to detect the presence of certain molecules or ions (e.g., Na+, Ca2+, Cl−, O2, CO2), substances such as glucose or cholesterol, or certain enzymes.

Although the gate 701 has been described as being formed over only a portion of the preservation layer 104, the gate 701 may be formed over substantially all of the preservation layer 104. As a result, a signal applied to the gate 701 may affect a larger portion of the channel area 105, increasing the sensitivity of the semiconductor device 900.

In another example, the first channel contact 102 and the second channel contact 103 may be a source contact and a drain contact for a transistor. Thus, the semiconductor device may form a FET.

Although two channel contacts 102 and 103 have been described, one of ordinary skill in the art will understand that a semiconductor device may include more than two channel contacts and more than one gate.

Figure 10:
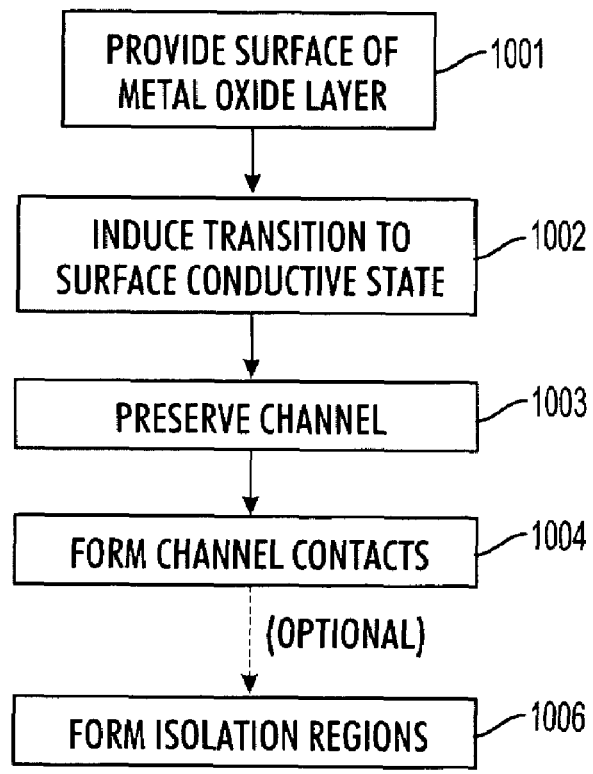
FIG. 10 shows a flowchart of an example of a method of forming a semiconductor device having a surface conducting channel.

FIG. 10 illustrates an example of a method of forming a semiconductor device having a surface conducting channel. A metal oxide layer having a surface is provided in 1001. A transition is induced in the metal oxide layer in 1004. A preservation layer is formed in 1002, defining a channel area of the surface of the metal oxide layer. Channel contacts are formed coupled to the channel area in 1003.

Figure 11:
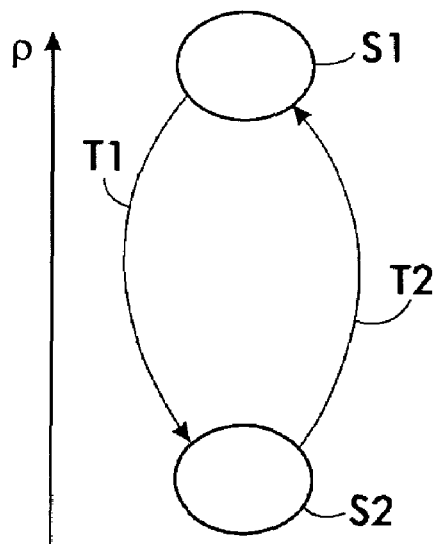
FIG. 11 shows states and transitions between states of a metal oxide layer.

Inducing the transition of the metal oxide layer in 1004 may cause the resistivity of the metal oxide layer to become less resistive. FIG. 11 shows states and transitions between states of a metal oxide layer. The metal oxide layer in state S1 is in a higher resistivity state. Such a state S1 may occur when the metal oxide layer is in an atmosphere containing oxygen. The metal oxide layer in state S2 has a lower resistivity than in state S1. The lower resistivity may be a result of a change of the surface of the metal oxide layer when the metal oxide layer is placed in a different atmosphere, for example, a vacuum. For example, Schmidt et. al., "Effects of an Electrically Conducting Layer at the Zinc Oxide Surface", Japanese Journal of Applied Physics, Vol. 44, pp. 7271-7274, October 2005, describes the transition between different resistivity states on ZnO bulk crystals and is incorporated by reference in its entirety.

Thus, the resistivity of the metal oxide layer depends on the state it is in. For example, if in state S1, the surface of the metal oxide layer is the same as the bulk of the metal oxide layer, then the resistivity of the entire metal oxide layer will be that of the bulk of the metal oxide layer. However, in state S2, the resistivity of the surface of the metal oxide layer may be decreased. Thus, the lower resistivity of the surface may dominate the resistivity of the metal oxide layer, causing the metal oxide layer to have a lower resistivity.

The metal oxide layer may make a transition from state S1 to state S2 or vice versa. Such transitions, labeled T1 and T2 respectively, may occur by placing the metal oxide layer in an atmosphere and applying an activation energy, such as heat. For example if state S2 is desired, the metal oxide layer may be placed in a vacuum and heated to cause the transition TI.

Referring to FIG. 10, forming the preservation layer in 1002 may include deposition methods such as chemical vapor deposition (CVD), plasma enhanced CVD (PECVD), pulsed laser deposition, molecular beam epitaxy (MBE), and metal organic CVD (MOCVD). In addition, a metal layer may be deposited on the metal oxide layer and subsequently oxidized. For example, deposition techniques such as sputtering, or thermal or e-beam evaporation may be used. The metal may be oxidized by performing the deposition or annealing the metal in an oxygen rich environment.

The formation of the preservation layer in 1002 may remove the effect the atmosphere has on the resistivity of the metal oxide layer. Thus, after inducing a state transition of the metal oxide layer to a desired state, the state may be preserved from the effects of a different atmosphere. For example, if state S2, the lower resistivity state, is induced in the metal oxide layer, a preservation layer formed on the metal oxide layer will preserve that state under the preservation layer if the atmosphere changes.

Although inducing a state transition has been described before forming a preservation layer, the preservation layer may be formed at the same time the metal oxide layer is changing states. For example, a dielectric material may be deposited in a vacuum at high temperatures to both induce the state change and form the preservation layer.

Although forming channel contacts 1003 has been described after forming a preservation layer 1002, one of ordinary skill in the art will understand the order may be any order. For example, the channel contacts may be formed on the surface of the metal oxide layer. Then, the preservation layer is formed over the surface between the channel contacts to define the channel area.

Alternatively, the preservation layer may be formed on the metal oxide layer. Then, areas of the preservation layer may be removed to expose the channel area. Channel contacts are then formed in the exposed areas.

Although some methods and sequences to define a channel area and form channel contacts have been described, one of ordinary skill in the art will appreciate that other methods may be used that result in a defined channel area and channel contacts coupled to the channel area.

As described above, a semiconductor device having a surface conducting channel may have an isolation region. Such an isolation region may be formed in 1006 by doping the isolation region to create a high resistivity region. For example, the isolation region may be selectively doped with lithium or copper. As a result, the isolation region becomes a high resistivity region, isolating adjacent semiconductor devices from each other.

In addition, as described above, the semiconductor device may be formed on a mesa of the metal oxide. The metal oxide forming the mesa may be formed in a variety of ways. For example, the mesa may be selectively deposited using a mask defining the mesa. Alternatively, a larger region of the metal oxide may be formed and then selectively etched, leaving the metal oxide mesa.

Furthermore, an insulating preservation layer may be formed surrounding the semiconductor device. For example, an insulating preservation layer, such as polyimide, may be deposited along the perimeter of the semiconductor device. The insulating preservation layer preserves the non-conductive state of the surface of the metal oxide layer, creating a high resistivity around the semiconductor device. Although polyimide may be deposited to form an insulating preservation layer, other layers may be deposited, such as organic coatings including self-assembled monolayers such as alkylsiloxanes, fatty acids, and alkanethiolates.

Another example of a method of forming a semiconductor device having a surface conducting channel may include forming the preservation layer on all areas of the surface of the metal oxide layer between the channel contacts. For example, referring to FIG. 7, any path between the channel contacts 102 and 103 passes under the preservation layer 104. Thus each path passes through the channel area 105.

In addition, the semiconductor device may be bounded by an insulating preservation layer as show in FIG. 8. Since the channel area 105 is not disposed substantially under the insulating preservation layer, the channel area is disposed substantially under the preservation layer 104. Thus any path through the channel area 105 passes under the preservation layer.

In another example of a method of forming a semiconductor device having a surface conducting channel, the metal oxide layer may be formed on a semiconductor substrate. For example, the metal oxide may be deposited on a semiconductor substrate. Such a semiconductor substrate may include silicon, glass, and sapphire.

As described above, a gate may be formed on the preservation layer. Preferably, the gate may be formed such that every path through the channel area is covered by the gate at at least one point. Thus, since such a semiconductor device may be normally on, the resistivity of all of the channel area may be increase because of the signal applied to the gate. If a path between the channel contacts is not covered, the current may flow through the lower resistivity region not covered by the gate.

As described above, a biological or chemical gate may be formed on the preservation layer. The gate may be formed by depositing functionalized molecules that improve adhesion with desired molecules and reduces adhesion with undesired molecules. Thus, biological or chemical molecules may be absorbed at the gate and modulate the channel area under the gate.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A method of making a semiconductor device comprising:
    providing a metal oxide layer having a surface;
    inducing the metal oxide layer to transition to a surface conducting state;
    forming a preservation layer on at least a part of the surface to define a channel area; and
    forming at least two channel contacts coupled to the channel area.

2. The method of making a semiconductor device of claim 1, providing the metal oxide layer further comprises one selected from the group consisting of providing a zinc oxide layer and providing a magnesium zinc oxide layer.

3. The method of making a semiconductor device of claim 1, forming the channel contacts further comprising:
    removing an area of the preservation layer for each channel contact;
    forming each channel contact on the respective area removed from the preservation layer.

4. The method of making a semiconductor device of claim 1, further comprising one of the group consisting of:
    doping the metal oxide layer to create a high resistivity area outside of the channel area;
    forming a mesa of the metal oxide layer to provide the surface of the metal oxide layer; and
    forming an insulating preservation layer on the surface substantially surrounding the semiconductor device.

5. The method of making a semiconductor device of claim 1, forming the preservation layer further comprising forming the preservation layer on all areas of the surface of the metal oxide layer between any two of the channel contacts.

6. The method of making a semiconductor device of claim 1, providing the surface of the metal oxide layer further comprising forming the metal oxide layer on a semiconductor substrate.

7. The method of making a semiconductor device of claim 1, further comprising forming a gate on the preservation layer substantially over every path over the preservation layer between the channel contacts.

8. The method of making a semiconductor device of claim 7, wherein forming a gate further comprises forming at least one selected from the group consisting of a metal gate, a transparent conducting metal oxide, a biological gate, and a chemical gate.

* * * * *